United States Patent
Na et al.

(10) Patent No.: US 10,227,037 B2
(45) Date of Patent: Mar. 12, 2019

(54) VEHICLE LAMP DEVICE HAVING ADJUSTABLE LIGHT EMITTING SURFACE

(71) Applicant: LG ELECTRONICS INC., Seoul (KR)

(72) Inventors: Taeyoung Na, Seoul (KR); Ana Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 78 days.

(21) Appl. No.: 15/393,613

(22) Filed: Dec. 29, 2016

(65) Prior Publication Data
US 2017/0191634 A1    Jul. 6, 2017

(30) Foreign Application Priority Data
Dec. 30, 2015    (KR) .......................... 10-2015-0189711

(51) Int. Cl.
*B60Q 1/04*    (2006.01)
*B60Q 1/072*    (2006.01)
(Continued)

(52) U.S. Cl.
CPC ............. *B60Q 1/38* (2013.01); *B60Q 1/0483* (2013.01); *B60Q 1/072* (2013.01); *B60Q 1/076* (2013.01);
(Continued)

(58) Field of Classification Search
CPC ........ B60Q 1/38; B60Q 1/0483; B60Q 1/072; B60Q 1/076; B60Q 2200/34;
(Continued)

(56) References Cited

U.S. PATENT DOCUMENTS 5,530,629 A * 6/1996 Uehara ................ B60Q 1/0683
362/273
7,753,575 B2 * 7/2010 Mochizuki ............. B60Q 1/076
362/545
(Continued)

FOREIGN PATENT DOCUMENTS

DE    102005003633    8/2006
DE    102013223717    5/2015
(Continued)

OTHER PUBLICATIONS

Extended European Search Report in European Application No. 16207584.0, dated May 29, 2017, 7 pages (with English translation).

*Primary Examiner* — Anh T Mai
*Assistant Examiner* — Arman B Fallahkhair
(74) *Attorney, Agent, or Firm* — Fish & Richardson P.C.

(57) ABSTRACT

A lamp device for a vehicle includes a lamp housing and a light-emitting unit disposed therein. The light-emitting unit includes a light-emitting surface adjustable in at least one of a shape, an intensity of illumination, or a color of illumination. The lamp device further includes a bracket that supports the light-emitting unit to be mounted in the lamp housing, and that is configured to change the shape of the light-emitting surface of the light-emitting unit. The lamp device further includes a driving unit configured to apply a driving force to the bracket that changes the shape of the light-emitting surface of the light-emitting unit. The lamp device is configured to at least partially change, based on a plurality of lighting modes, at least one of the shape of the light-emitting surface, the intensity of illumination emitted from the light-emitting surface, or the color of illumination emitted from the light-emitting surface.

17 Claims, 12 Drawing Sheets

(51) Int. Cl.
*B60Q 1/076* (2006.01)
*B60Q 1/38* (2006.01)
*H05K 1/18* (2006.01)
*F21S 43/00* (2018.01)
*F21S 41/19* (2018.01)
*F21S 41/155* (2018.01)
*F21S 41/60* (2018.01)
*F21S 41/657* (2018.01)
*F21S 43/145* (2018.01)

(52) U.S. Cl.
CPC ........... *F21S 41/155* (2018.01); *F21S 41/192* (2018.01); *F21S 41/60* (2018.01); *F21S 41/657* (2018.01); *F21S 43/00* (2018.01); *F21S 43/145* (2018.01); *H05K 1/189* (2013.01); *B60Q 2200/34* (2013.01); *B60Q 2300/122* (2013.01); *B60Q 2300/132* (2013.01); *B60Q 2300/134* (2013.01); *B60Q 2400/00* (2013.01)

(58) Field of Classification Search
CPC ........ B60Q 2300/122; B60Q 2300/132; B60Q 2300/134; B60Q 2400/00; F21S 43/00; F21S 43/145; F21S 41/155; F21S 41/192; F21S 41/657; F21S 41/60; H05K 1/189
See application file for complete search history.

(56) References Cited

U.S. PATENT DOCUMENTS

| | | | |
|---|---|---|---|
| 8,360,625 B2* | 1/2013 | Shibata | B60Q 1/076 362/523 |
| 8,430,530 B2* | 4/2013 | Aurongzeb | F21V 14/02 362/249.03 |
| 9,534,759 B2* | 1/2017 | Gubing | B60Q 1/0035 |
| 2008/0198617 A1* | 8/2008 | Schwab | B60Q 1/076 362/545 |
| 2013/0049570 A1 | 2/2013 | Natsume | |
| 2014/0056020 A1 | 2/2014 | Bungenstock et al. | |
| 2018/0073700 A1* | 3/2018 | Orisich | F21S 41/63 |
| 2018/0118093 A1* | 5/2018 | Yamazumi | B60Q 1/076 |

FOREIGN PATENT DOCUMENTS

| | | |
|---|---|---|
| JP | 9286274 A | 11/1997 |
| JP | 2001202809 A | 7/2001 |
| KR | 10-2002-0055084 | 7/2002 |
| KR | 10-1191218 | 10/2012 |
| KR | 10-2013-0031116 | 3/2013 |
| KR | 2013041781 A | 4/2013 |
| WO | 2017032587 | 3/2017 |

* cited by examiner

VEHICLE LAMP DEVICE HAVING ADJUSTABLE LIGHT EMITTING SURFACE

CROSS-REFERENCE TO RELATED APPLICATIONS

This application claims an earlier filing date and right of priority to Korean Patent Application No. 10-2015-0189711, filed on Dec. 30, 2015 in the Korean Intellectual Property Office, the disclosure of which is incorporated herein by reference in its entirety.

TECHNICAL FIELD

The present disclosure relates to a lamp device for a vehicle.

BACKGROUND

In general, a vehicle is equipped with various lamp devices, such as a headlamp for illuminating the area ahead of the vehicle, a turn signal lamp for indicating a change in the traveling direction of the vehicle, a fog lamp for indicating the position of the vehicle in fog, a brake lamp for indicating a braking action of the vehicle, a rear lamp for illuminating the area behind the vehicle when the vehicle travels backwards, and a tail lamp for indicating the overall width of the vehicle to drivers behind the vehicle.

A lamp for a vehicle typically includes a light source for emitting light, a reflector for reflecting the light emitted from the light source in a forward direction, and a lens for refracting the light reflected by the reflector and forming a light distribution pattern.

A bulb or a light-emitting diode (LED) is often used as the light source for a vehicle lamp. The light emitted from the bulb or the LED is typically reflected forward by the reflector and is refracted while passing through the lens, thereby forming a desired light distribution pattern.

SUMMARY

Systems and techniques are disclosed that enable a lamp device of a vehicle to dynamically adapt to different lighting modes by utilizing one or more bendable light-emitting units.

In one aspect, a lamp device for a vehicle may include a lamp housing and a light-emitting unit disposed in the lamp housing. The light-emitting unit may include a light-emitting surface that is configured to be adjustable in at least one of a shape, an intensity of illumination, or a color of illumination. The lamp device may also include a bracket configured to support the light-emitting unit to be mounted in the lamp housing, and configured to change the shape of the light-emitting surface of the light-emitting unit. The lamp device may also include a driving unit configured to apply a driving force to the bracket that changes the shape of the light-emitting surface of the light-emitting unit. The lamp device may be configured to at least partially change, based on a plurality of lighting modes, at least one of the shape of the light-emitting surface, the intensity of illumination emitted from the light-emitting surface, or the color of illumination emitted from the light-emitting surface.

In some implementations, the light-emitting unit may be disposed in surface contact with a first surface of the bracket, and based on the driving unit applying the driving force to the bracket, the light-emitting surface of the light-emitting unit may be changed in shape in conjunction with a change in shape of the bracket.

In some implementations, the driving unit may include: an operating rod connected to a rear surface of the bracket; and a driving motor configured to drive the operating rod. The driving unit may be a first driving unit among a plurality of driving units, and the plurality of driving units may be coupled to the bracket.

In some implementations, the plurality of lighting modes may include a traveling direction radiation mode in which light is emitted from the light-emitting surface of the light-emitting unit in a forward traveling direction of the vehicle, a first lateral turning direction radiation mode in which light is emitted from the light-emitting surface of the light-emitting unit in a first lateral direction of the vehicle, a second lateral turning direction radiation mode in which light is emitted from the light-emitting surface of the light-emitting unit in a second lateral direction of the vehicle that is opposite the first lateral direction, a high beam radiation mode in which light is emitted from the light-emitting surface of the light-emitting unit in an upward direction, and a low beam radiation mode in which light is emitted from the light-emitting surface of the light-emitting unit in a downward direction. The plurality of driving units may include a first lateral driving unit configured to, based on the lamp device being in the traveling direction radiation mode, move the bracket so that light is emitted in the first lateral direction for the first lateral turning direction radiation mode; a second lateral driving unit configured to, based on the lamp device being in the traveling direction radiation mode, move the bracket so that light is emitted in the second lateral direction for the second lateral turning direction radiation mode; an upper driving unit configured to, based on the lamp device being in the traveling direction radiation mode, move the bracket so that light is emitted in an upward direction for the high beam radiation mode; and a lower driving unit configured to, based on the lamp device being in the traveling direction radiation mode, move the bracket so that light is emitted in a downward direction for the low beam radiation mode. The upper driving unit, the lower driving unit, the first lateral driving unit, and the second lateral driving unit may be coupled to a plurality of points on the rear surface of the bracket and configured to respectively change the shape of an upper end portion of the bracket, a lower end portion of the bracket, a first lateral end portion of the bracket, and a second lateral end portion of the bracket that is opposite the first lateral end portion.

In some implementations, the bracket may include a fixed portion corresponding to the light-emitting surface of the light-emitting unit that is configured to emit light for the traveling direction radiation mode; and movable portions configured to be moved by the first lateral driving unit, the second lateral driving unit, the upper driving unit, and the lower driving unit to change the shape of the light-emitting surface of the light-emitting unit.

In some implementations, the lamp device may further include a driving unit controller configured to control the plurality of driving units; and a light emission controller configured to control the intensity of illumination and the color of illumination emitted from an entire region or a partial region of the light-emitting surface of the light-emitting unit. The driving unit controller may be configured to, in the first lateral turning direction radiation mode or the second lateral turning direction radiation mode, control the first lateral driving unit and the second lateral driving unit such that the first lateral end portion and the second lateral end portion of the bracket are bent forward or backward about the fixed portion of the bracket.

In some implementations, the light emission controller may be configured to, in the first lateral turning direction radiation mode or the second lateral turning direction radiation mode, control the light-emitting unit such that light emitted from a first lateral portion of the light-emitting surface corresponding to a direction in which the vehicle turns is different from light emitted from a second lateral portion of the light-emitting surface that is opposite the first lateral portion of the light-emitting surface.

In some implementations, the plurality of lighting modes may further include a turn signal mode in which light is emitted from the light-emitting surface of the light-emitting unit in a turning direction of the vehicle. The light-emitting unit may further include a plurality of matrix light-emitting cells provided on the light-emitting surface in a form of a band shape extending in a vertical direction and spaced apart from each other in a horizontal direction. The light emission controller may further be configured to, in the first lateral turning direction radiation mode or the second lateral turning direction radiation mode, control the light-emitting unit such that the plurality of matrix light-emitting cells flash or turn on to indicate the turning direction of the vehicle in the turn signal mode.

In some implementations, the driving unit controller may be further configured to: control, in the high beam radiation mode or the low beam radiation mode, the upper driving unit and the lower driving unit such that the upper end portion and the lower end portion of the bracket are bent in a same direction about the fixed portion of the bracket.

In some implementations, the light emission controller may be further configured to: control, in the high beam radiation mode or the low beam radiation mode, the light-emitting unit such that light emitted from an upper portion of the light-emitting surface is different than light emitted from a lower portion of the light-emitting surface.

In some implementations, the lamp device may further include: a vehicle inclination detection unit configured to detect a transverse inclination of the vehicle, a longitudinal inclination of the vehicle, and a state of a road ahead of the vehicle. The driving unit controller may be further configured to control the driving unit and the light emission controller control is configured to control the light-emitting unit each based on information about the transverse inclination and the longitudinal inclination of the vehicle that is transferred from the vehicle inclination detection unit.

In some implementations, the driving unit controller may be further configured to, based on the vehicle inclination detection unit detecting that the vehicle is tilted in a first lateral direction or in a second lateral direction that is opposite the first lateral direction: control the driving unit such that light emitted from the light-emitting surface of the light-emitting unit is projected to a target area on which light is projected while the inclination of the vehicle detected by the vehicle inclination detection unit has a value of "0." The light emission controller may be further configured to, based on the vehicle inclination detection unit detecting that the vehicle is tilted in the first lateral direction or in the second lateral direction that is opposite the first lateral direction: control the intensity of the illumination emitted from the light-emitting unit such that a brightest part of the illumination is projected to the target area.

In some implementations, the driving unit controller may be further configured to, based on the light-emitting unit being disposed at a front portion of the vehicle, and based on a determination that a state of a road ahead of the vehicle detected by the vehicle inclination detection unit is a start point of an uphill road: control the upper driving unit and the lower driving unit to bend the upper end portion and the lower end portion of the bracket in a same direction about the fixed portion of the bracket. The light emission controller may be further configured to, based on the light-emitting unit being disposed at the front portion of the vehicle, and based on a determination that the state of the road ahead of the vehicle detected by the vehicle inclination detection unit is the start point of the uphill road: control the light-emitting unit such that an intensity of illumination of light emitted from an upper portion of the light-emitting surface is temporarily higher, until the vehicle has completely entered the uphill road, than an intensity of illumination of light emitted from a portion of the light-emitting surface other than the upper portion of the light-emitting surface.

In some implementations, the driving unit controller may be further configured to, based on the light-emitting unit being disposed at a front portion of the vehicle, and based on a determination that a state of a road ahead of the vehicle detected by the vehicle inclination detection unit is an end point of an uphill road or a start point of a downhill road: control the upper driving unit and the lower driving unit to bend the upper end portion and the lower end portion of the bracket in a same direction about the fixed portion of the bracket. The light emission controller may be further configured to, based on the light-emitting unit being disposed at the front portion of the vehicle, and based on a determination that the state of the road ahead of the vehicle detected by the vehicle inclination detection unit is the end point of the uphill road or the start point of the downhill road: control the light-emitting unit such that an intensity of illumination of light emitted from a lower portion of the light-emitting surface is higher than an intensity of illumination of light emitted from a portion of the light-emitting surface other than the lower portion of the light-emitting surface.

In some implementations, the driving unit controller may be further configured to, based on the light-emitting unit being disposed at a front portion of the vehicle, and based on a determination that a state of a road ahead of the vehicle detected by the vehicle inclination detection unit is an end point of a downhill road: control the upper driving unit and the lower driving unit to bend the upper end portion and the lower end portion of the bracket in a same direction about the fixed portion of the bracket. The light emission controller may be further configured to, based on the light-emitting unit being disposed at the front portion of the vehicle, and based on a determination that the state of the road ahead of the vehicle detected by the vehicle inclination detection unit is the start point of the uphill road: control the light-emitting unit such that an intensity of illumination of light emitted from an upper portion of the light-emitting surface is higher than an intensity of illumination of light emitted from a portion of the light-emitting surface other than the lower portion of the light-emitting surface.

In some implementations, the bracket may include: a fixed link plate configured to support a first region of a light-emitting surface formed on the light-emitting unit; and a movable link plate that is linked to the fixed link plate so as to be moved by the driving unit and configured to support a second region of the light-emitting surface other than the first region. The light-emitting unit may be one of a plurality of light-emitting units that are arranged in a horizontal direction in the lamp housing while being spaced a predetermined distance apart from each other, the bracket may be one of a plurality of brackets that are arranged in a horizontal direction in the lamp housing while being spaced a predetermined distance apart from each other, and the driving unit may be one of a plurality of driving units. A number of the plurality of driving units may be equal to a number of the plurality of light-emitting units and a number of the plurality of brackets.

In some implementations, the light-emitting surface of the light-emitting unit may include: a fixed light-emitting surface disposed at an upper portion of the light-emitting surface and supported by the fixed link plate; and a movable light-emitting surface disposed at a lower portion of the light-emitting surface and supported by the movable link plate. The fixed light-emitting surface may be slanted forward and downward or backward and downward at a first inclination angle with respect to a horizontal plane. The movable light-emitting surface may be slanted forward and downward or backward and downward at a second inclination angle that is larger than the first inclination angle with respect to the horizontal plane.

In some implementations, the lamp device may be further configured to, in the first lateral turning direction radiation mode or in the second lateral turning direction radiation mode, control the plurality of brackets and the plurality of light-emitting units such that: the light-emitting surface of each light-emitting unit is changed in shape and projects light to be concentrated on an area in a turning direction of the vehicle; and an intensity of illumination of light emitted from a first group of light-emitting units among the plurality of light-emitting units disposed at a position corresponding to a turning direction of the vehicle is higher than an intensity of illumination of light emitted from light-emitting units among the plurality of light-emitting units other than the first group of light-emitting units.

In some implementations, the lamp device may be further configured to: in the high beam radiation mode, control the plurality of brackets and the plurality of light-emitting units such that the light-emitting surface of each light-emitting unit is changed in shape so that projected light is concentrated on an area in an upward direction from a road surface, and in the low beam radiation mode, control the plurality of brackets and the plurality of light-emitting units such that the light-emitting surface of each light-emitting unit is changed in shape so that projected light is concentrated on an area in a downward direction toward a road surface.

In some implementations, the plurality of lighting modes may further include a turn signal lamp radiation mode in which a light-emitting unit disposed at a position corresponding to a turning direction of the vehicle is repeatedly turned on and off. The lamp device may be further configured to: based on the vehicle turning in a lateral direction, control the light-emitting unit disposed at a position corresponding to a turning direction of the vehicle to repeatedly turn on and off in the turn signal lamp radiation mode, and in the turn signal lamp radiation mode, control the plurality of light-emitting units to turn off or turn on sequentially from the light-emitting unit farthest from the turning direction of the vehicle to the light-emitting unit closest to the turning direction of the vehicle.

All or part of the features described throughout this application can be implemented as a computer program product including instructions that are stored on one or more non-transitory machine-readable storage media, and that are executable on one or more processing devices. All or part of the features described throughout this application can be implemented as an apparatus, method, or electronic system that can include one or more processing devices and memory to store executable instructions to implement the stated functions.

The details of one or more implementations are set forth in the accompanying drawings and the description below. Other features will be apparent from the description and drawings, and from the claims. The description and specific examples below are given by way of illustration only, and various changes and modifications will be apparent.

DETAILED DESCRIPTION

Systems and techniques are disclosed that enable a lamp device for a vehicle configured to form a variety of light distribution patterns with a simple constitution, making it possible to manufacture a high-quality vehicle and to ensure safe driving.

Some lamp devices configured to radiate light for a vehicle have a drawback in being limited in their range of functionality, thus requiring various types of lamp devices to be provided in a vehicle. Further, if the light source is fixed to the vehicle body, then different types of control elements, such as a reflector, may be required to generate light emissions having a variety of light distribution patterns. As a result, the overall construction of the lamp device becomes complicated, and the weight of the vehicle is increased.

Figure 1:
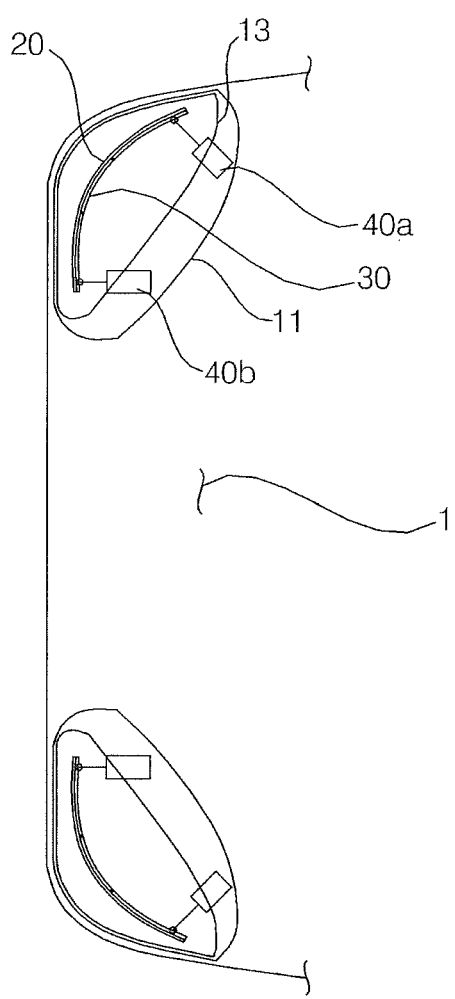
FIG. 1 is a diagram illustrating a horizontal sectional view showing an example of a lamp device for a vehicle according to an implementation.
Figure 2:
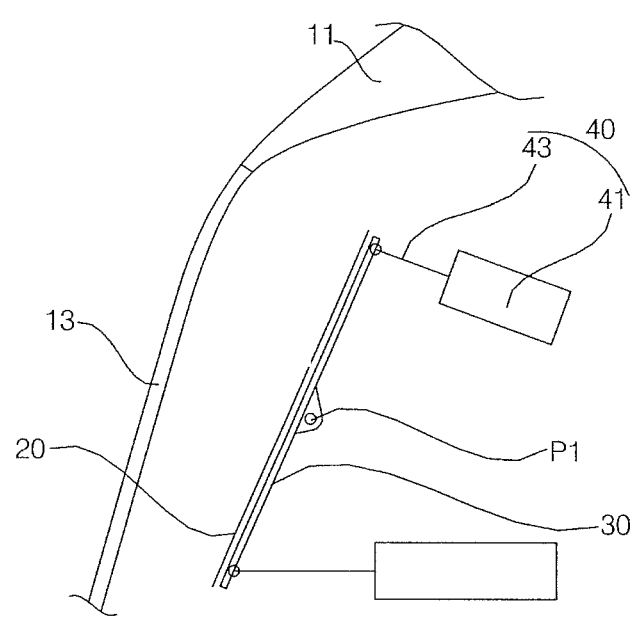
FIG. 2 is a diagram illustrating an example of a vertical sectional view of FIG. 1.
Figure 4A:
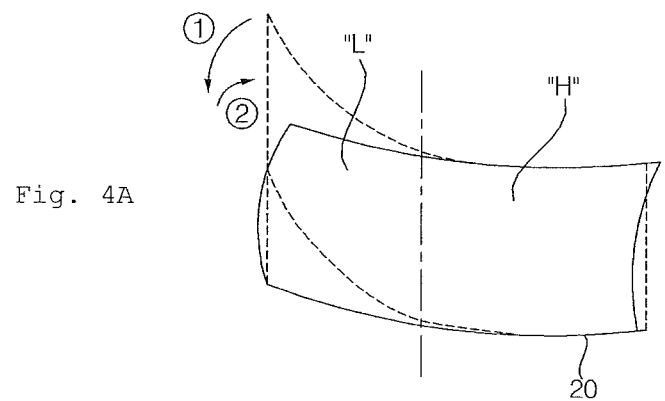
FIGS. 4A to 4C are diagrams illustrating examples of light distribution modes depending on a running state of a vehicle.
Figure 4B:
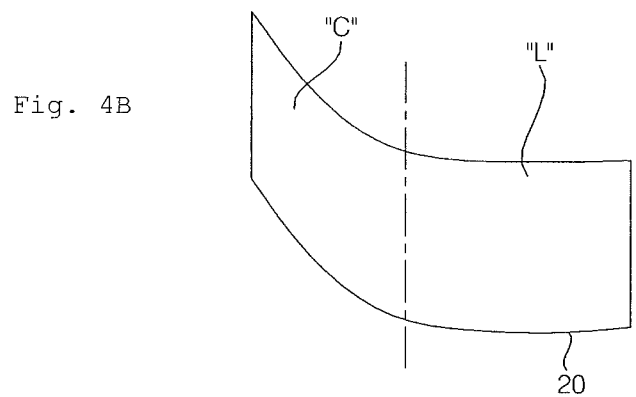
Figure 4C:
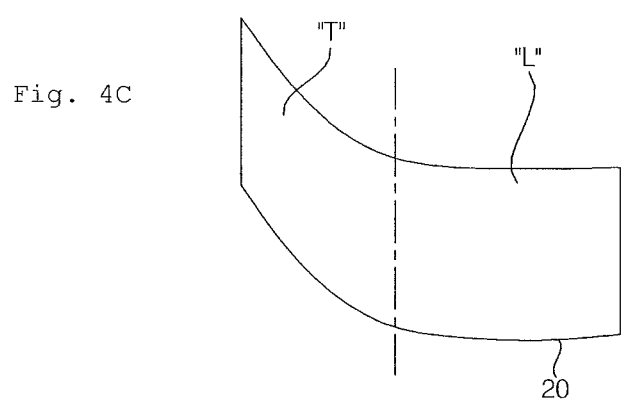
Figure 5:
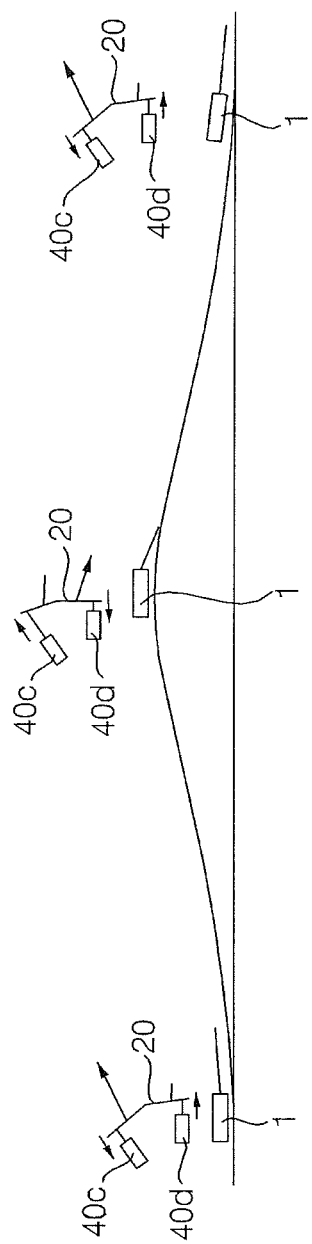
FIG. 5 is a diagram illustrating an example of control operations of a driving unit controller and a light emission controller while the vehicle runs on an uphill road and a downhill road.

FIG. 1 is a horizontal sectional view showing a lamp device for a vehicle according to an implementation, FIG. 2 is a vertical sectional view of FIG. 1, FIGS. 3A to 3D are horizontal sectional views and vertical sectional views showing a variety of light distribution modes using the lamp device for a vehicle according to some implementations. FIGS. 4A to 4C are diagrams showing a variety of light distribution modes depending on the running state of a vehicle, and FIG. 5 is a schematic view showing the control operation of a driving unit controller and a light emission controller while the vehicle runs on an uphill road and a downhill road.

An example of a lamp device for a vehicle according to an implementation, as shown in FIGS. 1 to 4C, includes a lamp housing 11 and a light-emitting unit 20 disposed in the lamp housing 11. The light-emitting unit 20 has a light-emitting surface having dynamically adjustable properties. For example, the lamp device may be configured so as to partially or completely change at least one of: the intensity of illumination emitted from the light-emitting surface of the light-emitting unit 20, the color of illumination emitted from the light-emitting surface of the light-emitting unit 20, or the shape of the light-emitting surface of the light-emitting unit 20. In some implementations, the lamp device may control one or more of these properties depending on a plurality of lighting modes for the lamp device.

The lamp device also includes a bracket 30, which enables the light-emitting unit 20 to be mounted in the lamp housing 11 and which supports the light-emitting unit 20. The bracket 30 is configured to move so as to change the shape of the light-emitting surface of the light-emitting unit 20. The lamp device also includes a driving unit 40, which applies driving force to the bracket 30 and controls movements of the bracket 30.

In the case in which the lamp housing 11 is used for a headlamp, the lamp housing 11 may be disposed on the left and right of the front end of the vehicle body. In the case in which the lamp housing 11 is used for a rear lamp, the lamp housing 11 may be disposed on the left and right of the rear end of the vehicle body.

The lamp device for a vehicle according to some implementations will be described with reference to a headlamp for convenience of explanation. However, the scope of the present disclosure is not limited to a headlamp, and also includes, for example, a rear lamp of a vehicle. Accordingly, the substantial scope of the present disclosure shall be determined only by the appended claims and their equivalents.

The lamp housing 11 may include a housing body that defines a space for mounting the driving unit 40 and the bracket 30. The lamp housing 11 may also include a transparent outer lens 13, which is made of a transparent material and shields an opening in the front portion or the rear portion of the housing body.

Although the shape of the lamp housing 11 is not limited to any particular shape and may instead be adapted depending on the design of the vehicle, an example of a lamp housing 11 having a shape that forms left and right corners of the front end of the vehicle body and left and right corners of the rear end of the vehicle body will be described below for convenience.

The light-emitting unit 20 may be implemented, for example, as a flexible organic light-emitting diode (flexible OLED; hereinafter referred to as an "F-OLED"). The F-OLED includes a light-emitting surface for generating and emitting light in the manner of an OLED, and has a function of changing in shape by being flexibly bent in one lateral direction or in the opposite lateral direction. In some implementations, the light-emitting unit 20 may be an F-OLED that is implemented as a plastic organic light-emitting diode (hereinafter, referred to as a "P-OLED"), which is fabricated by a printing method. Although any suitable F-OLED may be implemented, P-OLEDs in particular may have certain advantages. For example, if a DC driving method is applied to the P-OLED, then the light-emitting unit 20 may not necessarily require implementation of an inverter, and therefore may reduce electrical noise during operation. Further, a P-OLED may have an advantage of increased brightness (e.g., 250 cd/m$^2$ or greater), a longer lifespan (e.g., 10,000 hours or longer), and improved bendability if an ITO film is used as a base film, like an inorganic EL device.

Furthermore, a P-OLED may be configured to implement dynamically adjustable properties. For example, the P-OLED may be configured to freely control the intensity of illumination of all or part of the region of a single light-emitting surface, or change the color of the light emitted from the entire region or the partial region of the light-emitting surface so as to realize colorful light, and completely or partially be changeable in shape depending on a moving action of the bracket 30, which supports the P-OLED.

The bracket 30 is a structure configured for mounting the light-emitting unit 20. If the light-emitting unit 20 is implemented as a F-OLED, then as shown in the examples of FIGS. 1 to 4C, the light-emitting unit 20 may be implemented on a surface of the bracket 30. In the examples of FIGS. 1 to 4C, the bracket 30 is configured to be moved by the driving unit 40, and the moving action of the bracket 30 functions to change the shape of the light-emitting surface of the light-emitting unit 20.

The bracket 30 may be made of an elastic material, which is bent by the driving force transferred from the driving unit 40 and is then elastically restored to its original shape. Alternatively, the bracket 30 may be configured to be moved by a plurality of connected links, which will be described with reference to FIGS. 6 to 9 in connection with another implementation.

In the examples of FIGS. 1 to 4C, the driving unit 40 is mechanically connected with the bracket 30 so as to move the bracket 30 in a constant pattern, thus changing the shape of the light-emitting unit 20. Here, the change in the shape of the light-emitting unit 20 may correspond to a change in the radiation angle of the light-emitting surface of the light-emitting unit 20, which occurs when the bracket 30 is moved by a predetermined driving force applied thereto from the driving unit 40. The resulting change in radiation angle of the light-emitting surface of the light-emitting unit 20 can be determined by a person who observes the light-emitting unit 20 from a fixed position outside the vehicle.

As shown in the examples of FIGS. 1 to 4C, the light-emitting unit 20 may be disposed to be in surface contact with one surface of the bracket 30. Therefore, when the bracket 30 is manipulated by the driving unit 40, the light-emitting surface is changed in shape in conjunction with the bracket 30.

In particular, one surface of the bracket 30 may be in surface contact with a surface of the light-emitting unit 20 that is opposite a light-emitting surface.

A more detailed explanation of the operational process of the driving unit 40 and the bracket 30 is provided further below.

The driving unit 40, as shown in the examples of FIGS. 1 to 3D, may include an operating rod 43, which is connected to a rear surface of the bracket 30, and a driving motor 41 for moving the operating rod 43.

The driving motor 41 may be implemented, for example, as a general motor that is actuated by electric force. The operating rod 43 may be implemented, for example, as a solenoid that moves linearly in the axial direction of the motor.

The front end of the operating rod 43 may be directly hinged to the rear surface of the bracket 30. The shape of the bracket 30 may be changed by the driving motor 41 applying a pushing or pulling motion on the portion of the operating rod 43 that is connected with the bracket 30 in a forward or backward direction.

The driving unit 40, which is coupled to the bracket 30 as described above, may be provided in a plural number. For example, a plurality of driving units 40 may be coupled to a plurality of points on the rear surface of the bracket 30 so as to respectively implement a change in shape of an upper portion, a lower portion, a lateral portion, or an opposite lateral portion of the bracket 30.

Figure 3A:
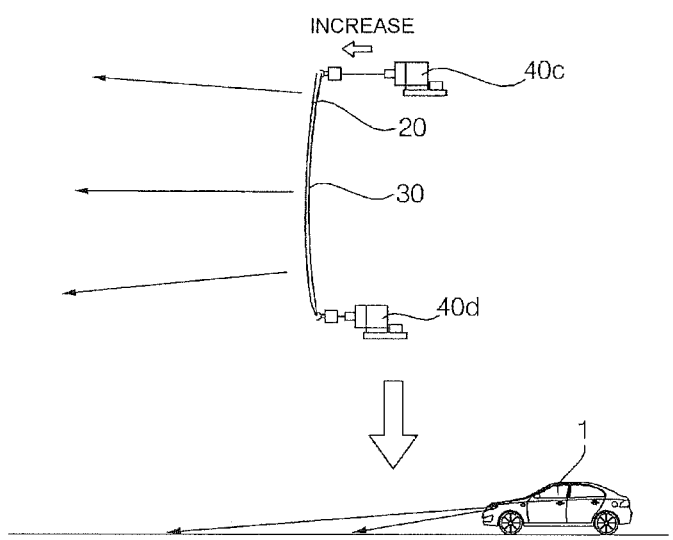
FIGS. 3A to 3D are diagrams illustrating horizontal sectional views and vertical sectional views showing examples of light distribution modes using the lamp device for a vehicle according to an implementation.
Figure 3B:
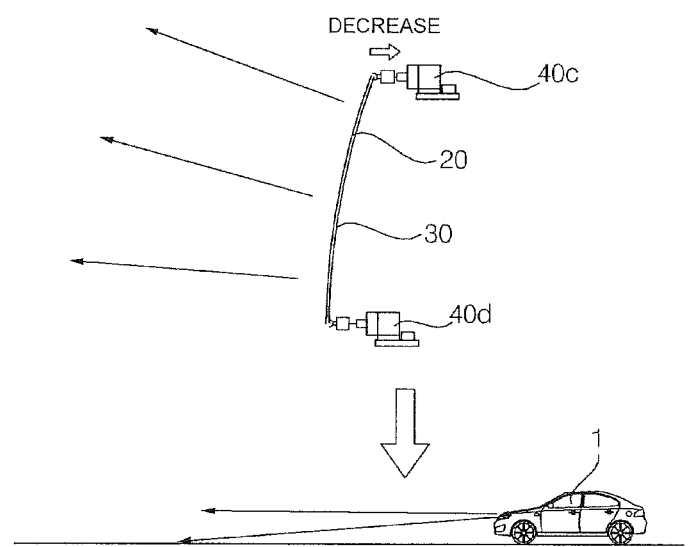
Figure 3C:
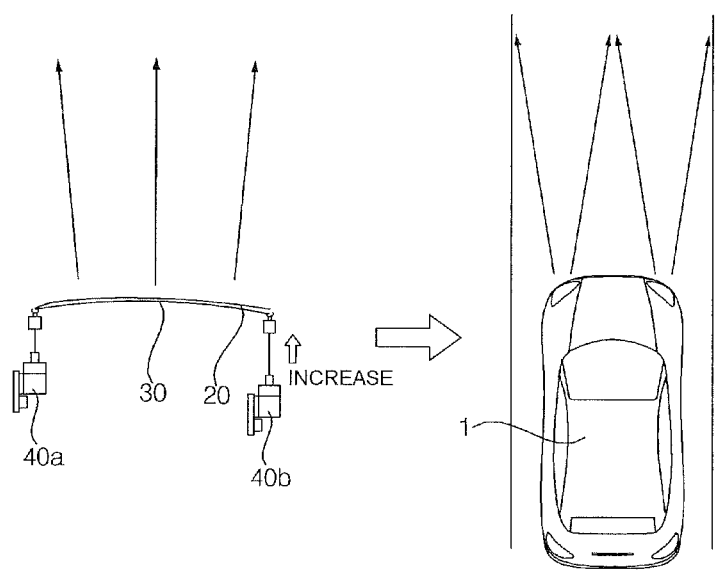
Figure 3D:
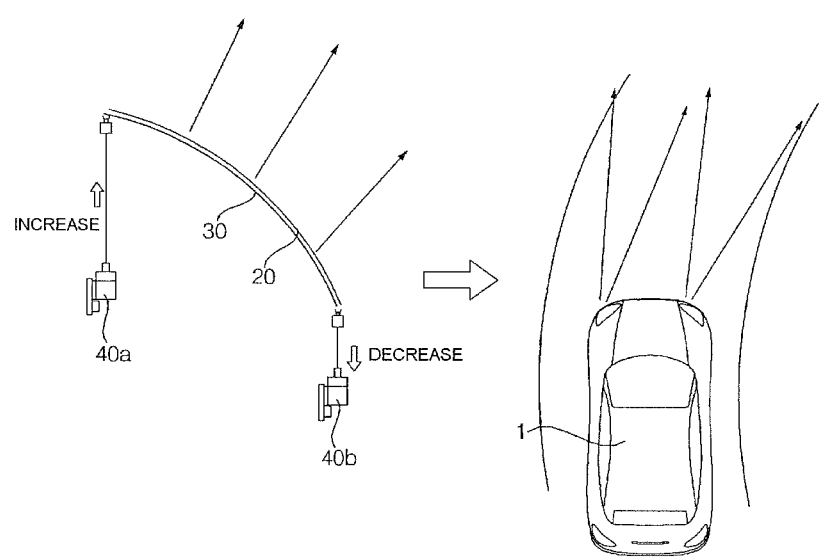

As shown in the examples of FIGS. 3A and 3B, one driving unit 40c may be disposed at an upper portion in the lamp housing 11 and another driving unit 40d may be disposed at a lower portion in the lamp housing 11 so that the upper end portion and the lower end portion of the bracket 30 can be deformed about the fixed middle portion of the bracket 30. Alternatively, as shown in the examples of FIGS. 3C and 3D, one driving unit 40a may be disposed at a left portion in the lamp housing 11 and another driving unit 40b may be disposed at a right portion in the lamp housing 11 so that the left end portion and the right end portion of the bracket 30 can be deformed about the fixed middle portion of the bracket 30.

However, implementations are not limited to a pair of driving units 40c/d or 40a/b being coupled to the bracket 30. Instead, depending on the implementation, one of the upper end portion or the lower end portion of the bracket 30 or one of the left end portion or the right end portion of the bracket 30 may be fixed, and a single driving unit 40 may be coupled to the other end portion of the bracket 30.

A lamp device for a vehicle configured according to the above implementations may have an advantage of utilizing a simplified structure to achieve a variety of light distribution modes depending on the running state of the vehicle.

In general, the light distribution modes of the traveling vehicle may include a traveling direction radiation mode for emitting light forward, e.g., in the traveling direction of the vehicle, a one lateral turning direction radiation mode for emitting light in one lateral turning direction of the vehicle, an opposite lateral turning direction radiation mode for emitting light in the opposite lateral turning direction of the vehicle, a low beam radiation mode for emitting light below the horizontal plane in the traveling direction of the vehicle while driving at night, a high beam radiation mode for emitting light above the horizontal plane in the traveling direction of the vehicle while driving at night, and a turn signal lamp radiation mode for flashing a turn signal lamp corresponding to the turning direction of the vehicle.

Here, a plurality of driving units 40 may be coupled to a plurality of points on the rear surface of the bracket 30 so as to be respectively involved in changing the shape of the upper portion, the lower portion, one lateral portion and the opposite lateral portion of the bracket 30.

In the lamp device for a vehicle according to an implementation, which includes the light-emitting unit 20 and the driving unit 40 described above, as shown in FIG. 2, the light-emitting unit 20 may be arranged so as to be slanted forward and downward (e.g., when used for a headlamp) or to be slanted backward and downward (e.g., when used for a rear lamp) in the traveling direction radiation mode, among the above-described light distribution modes.

The lamp device for a vehicle according to an implementation may further include a driving unit controller for controlling a plurality of driving units 40, and a light emission controller for controlling the intensity of illumination and the color of the light emitted from the entire region or the partial region of the light-emitting surface of the light-emitting unit 20.

The driving unit controller, which is configured to control a plurality of driving units 40, functions to make the operating rod 43 of each of the driving units 40 move linearly, thereby changing the shape of the light-emitting unit 20 so as to accurately achieve each of the respective light distribution modes.

The light emission controller may perform a control process to control an intensity or color of illumination emitted from all or partial regions of the light-emitting surface. For example, the light emission controller may perform a control process such that light having a single intensity of illumination and a single color is emitted from the entire region of the light-emitting surface. Alternatively, the light emission controller may perform a control process such that light emitted from one region of the light-emitting surface and the light emitted from another region have different intensities of illumination and/or different colors.

In the traveling direction radiation mode, as shown in the example of FIG. 2, the light-emitting unit 20 is not changed in shape and emits light with constant intensity of illumination. In this scenario, the driving unit controller and the light emission controller are not necessarily operated.

The middle portion on the rear surface of the bracket 30 is secured to the interior of the lamp housing 11, and the bracket 30 is made of a flexible material such that one lateral portion, the opposite lateral portion, the upper end portion and the lower end portion of the bracket 30 are capable of being bent forward and backward about the middle portion of the bracket 30, which is secured to the lamp housing 11.

The shape of the light-emitting surface is changed by the driving unit controller, which controls a plurality of driving units 40 such that the operating rod 43 of each of the driving units 40 performs a linear sliding motion. The driving unit controller controls a plurality of driving units 40 in different ways depending on the corresponding light distribution mode. In general, the driving unit controller controls a one lateral driving unit 40a and an opposite lateral driving unit 40b so that the upper end portion and the lower end portion of the bracket 30 and one lateral end portion and the opposite lateral end portion of the bracket 30 are bent forward or backward about the fixed portion of the bracket 30.

Preferably, in some implementations, one lateral end portion and the opposite lateral end portion of the bracket 30 or the upper end portion and the lower end portion of the bracket 30, which is moved by the driving unit controller, may be bent by the operating rod 43, which slides linearly in the axial direction of the driving unit 40.

In the low beam radiation mode, as shown in FIG. 3A, the driving unit controller performs a control process such that the light-emitting surface, which has been slanted forward and downward or slanted backward and downward in the traveling direction radiation mode, is changed in shape so as to be oriented substantially vertically. To this end, the lower end portion of the bracket 30 may be pulled using a lower driving unit 40d, or the upper end portion of the bracket 30 may be pushed using an upper driving unit 40c. Alternatively, it may be controlled such that the lower driving unit 40d pulls the lower end portion of the bracket 30 and the upper driving unit 40c pushes the upper end portion of the bracket 30.

In the high beam radiation mode, as shown in FIG. 3B, the driving unit controller performs a control process such that the light-emitting surface, which has been slanted forward and downward or slanted backward and downward in the traveling direction radiation mode, is changed in shape so as to be further slanted. To this end, the lower end portion of the bracket 30 may be pushed using the lower driving unit 40d, or the upper end portion of the bracket 30 may be pulled using the upper driving unit 40c. Alternatively, the lamp device may be controlled such that the lower driving unit 40d pushes the lower end portion of the bracket 30 and the upper driving unit 40c pulls the upper end portion of the bracket 30.

In some scenarios, implementations described herein may have an advantage in that light is emitted in the direction desired by a driver through a simple control process of the driving unit controller, which controls the lower driving unit 40d and the upper driving unit 40c such that they are simply operated in opposite directions to each other in the low beam radiation mode and the high beam radiation mode.

Further, in the one lateral turning direction radiation mode or the opposite lateral turning direction radiation mode, the driving unit controller may control the one lateral driving unit 40a and the opposite lateral driving unit 40b such that one lateral end portion and the opposite lateral end portion of the bracket 30 are bent forward or backward about the fixed portion of the bracket 30.

In the lamp device for a vehicle according to some implementations, the lamp housing 11 is mounted to the left and right corners of the front and rear ends of the vehicle body. Therefore, the light-emitting surface of the light-emitting unit 20 is configured to emit light to the area ahead of the vehicle from the front end of the vehicle body and to emit light to the area behind the vehicle from the rear end of the vehicle body. Further, the light-emitting surface is also configured to emit light in the left or right turning direction of the vehicle from the front and rear ends of the vehicle body.

For example, in the case in which the light-emitting surface of the light-emitting unit 20 is provided in the front-right lamp housing 11, the light-emitting surface may have a shape that is bent rearward and to the right. Conversely, in the case in which the light-emitting surface of the light-emitting unit 20 is provided in the front-left lamp housing 11, the light-emitting surface may have a shape that is bent rearward and to the left. This arrangement of the light-emitting unit 20 in the front-right and front-left lamp housings 11 is also identically applied to the case in which the light-emitting unit 20 is provided in the rear-right and rear-left lamp housings 11.

Hereinafter, for convenience of explanation, only the case in which the light-emitting unit 20 is provided in the lamp housing 11 mounted to the front-right corner of the vehicle body will be described with reference to FIGS. 3C and 3D. However, it should be understood that the scope of the present disclosure is not limited to this case.

Described in more detail, in the traveling direction radiation mode when the vehicle travels straight, as shown in FIG. 3C, in order to maximize the amount of light that is emitted from the light-emitting surface to the area ahead of the vehicle, the driving unit controller may perform a control process such that one lateral portion of the front-right bracket 30, which has been bent, is pushed forward by increasing the length of the operating rod 43 of the one lateral driving unit 40a, or such that the opposite lateral portion of the front-right bracket 30 is pulled backward by decreasing the length of the operating rod 43 of the opposite lateral driving unit 40b. Alternatively, the driving unit controller may perform a control process such that one lateral portion of the front-right bracket 30 is pushed forward by increasing the length of the operating rod 43 of the one lateral driving unit 40a and the opposite lateral portion of the front-right bracket 30 is pulled backward by decreasing the length of the operating rod 43 of the opposite lateral driving unit 40b.

In this case, since the entire region of the light-emitting surface of the light-emitting unit 20 is oriented forward in the traveling direction of the vehicle, the light emitted from the light-emitting surface is concentrated on the area ahead of the vehicle, thereby effectively achieving the traveling direction radiation mode.

In the one lateral turning direction radiation mode when the vehicle turns in one lateral direction (to the right in the drawing), as shown in FIG. 3D, in order to increase the amount of light that is emitted from the light-emitting surface to the area toward which the vehicle turns, the driving unit controller may perform a control process such that one lateral portion of the front-right bracket 30 is pulled backward by decreasing the length of the operating rod 43 of the one lateral driving unit 40a, or such that the opposite lateral portion of the front-right bracket 30 is pushed forward by increasing the length of the operating rod 43 of the opposite lateral driving unit 40b. Alternatively, the driving unit controller may perform a control process such that one lateral portion of the front-right bracket 30 is pulled backward by decreasing the length of the operating rod 43 of the one lateral driving unit 40a and the opposite lateral portion of the front-right bracket 30 is pushed forward by increasing the length of the operating rod 43 of the opposite lateral driving unit 40b.

In some implementations, driving unit controller may control the driving unit 40, which is provided in the front-left lamp housing 11. However, the control process with respect to the driving unit 40 provided in the front-left lamp housing 11 may be different from that shown in FIG. 3D. For instance, when the vehicle turns to the right, in some implementations it is preferable for the driving unit 40, which is disposed at the front right portion of the vehicle body, to be controlled as described above. However, since the light-emitting surface, which is disposed at the front left portion of the vehicle body, is bent rearward and to the left, the lamp device may be controlled such that the driving unit 40 disposed in the left end portion of the front-left lamp housing 11 pushes the left end portion of the bracket 30 forward and the driving unit 40 disposed in the right end portion of the front-left lamp housing 11 pulls the right end portion of the bracket 30 backward.

In this case, since the entire region of the light-emitting surface of the light-emitting unit 20 is oriented in the direction in which the vehicle turns, the light emitted from the light-emitting surface is concentrated on the area toward which the vehicle turns, thereby effectively achieving the one lateral turning direction radiation mode.

The light-emitting unit 20 may further include a plurality of matrix light-emitting cells, which are provided on the light-emitting surface in the form of a band shape extending in the vertical direction while being spaced apart from each other in the horizontal direction.

In the lamp device for a vehicle according to the present disclosure, as described above, the light-emitting unit 20 is embodied as a P-OLED, and it is possible to perform various control processes using a plurality of matrix light-emitting cells, which are provided on some region of the light-emitting surface.

In the one lateral turning direction radiation mode or the opposite lateral turning direction radiation mode, as described above, the light emission controller may perform a control process such that the matrix light-emitting cells flash or turn on to indicate the direction in which the vehicle is turning.

For example, when the vehicle turns to the left, the light emission controller may perform a control process such that a plurality of matrix light-emitting cells, which are provided at the light-emitting unit 20, disposed at the front left portion and the rear left portion of the vehicle body, are activated and such that the matrix light-emitting cells are turned on sequentially from the matrix light-emitting cell located at the rightmost position on the light-emitting surface of the light-emitting unit 20 to the matrix light-emitting cell located at the leftmost position. However, the matrix light-emitting cells are not necessarily turned on in a sequential lighting manner, but may flash such that they are repeatedly turned on and off at short time intervals.

In general, the light distribution mode, in which the lamp disposed at the position corresponding to the direction in which the vehicle turns is turned on and off, is referred to as a "turn signal lamp radiation mode".

In the one lateral turning direction radiation mode or the opposite lateral turning direction radiation mode, the light emission controller may control the light-emitting unit 20 such that the light-emitting surface of the light-emitting unit 20, which is disposed at a lateral portion corresponding to the direction in which the vehicle turns, and the light-emitting surface, which is disposed at the opposite lateral portion, perform light emission in different ways from each other.

Here, the phrase "light emission in different ways from each other" includes the meaning that the light-emitting surface that is disposed at a lateral portion corresponding to the direction in which the vehicle turns and the light-emitting surface that is disposed at the opposite lateral portion are controlled to emit light having different colors and different intensities of illumination from each other by the light emission controller.

For example, when the vehicle turns to the right, the lamp device may be controlled such that the intensity of illumination of the light emitted from the light-emitting surface of the light-emitting unit 20 that is disposed at a lateral portion (e.g., the right portion) corresponding to the direction in which the vehicle turns is higher than that of the light emitted from the light-emitting surface that is disposed at the opposite lateral portion (e.g., the left portion), and such that the color of the light emitted from the light-emitting surface that is disposed at a lateral portion (e.g., the right portion) corresponding to the direction in which the vehicle turns has higher visibility than that of the light emitted from the light-emitting surface that is disposed at the opposite lateral portion (e.g., the left portion) in order to effectively alert nearby drivers.

Similarly, in the high beam radiation mode or the low beam radiation mode, the light emission controller may control the light-emitting unit 20 such that the light-emitting surface of the light-emitting unit 20 disposed at an upper portion and the light-emitting surface disposed at a lower portion perform light emission in different ways from each other.

For example, when the high beam radiation mode is selected, the upper light-emitting surface of the light-emitting unit 20, which is disposed at an upper portion, is more involved in the high beam emission than the lower light-emitting surface, which is disposed at a lower portion. Therefore, the lamp device may be controlled such that the intensity of illumination of the light emitted from the upper light-emitting surface is higher than that of the light emitted from the lower light-emitting surface, and such that the color of the light emitted from the upper light-emitting surface is one that is capable of being radiated farther than that of the light emitted from the lower light-emitting surface.

The lamp device for a vehicle according to an implementation has an advantage of having a very simple light-emitting unit 20, which is embodied merely as a P-OLED, and of being capable of achieving the above-described variety of light distribution modes by adequately controlling a plurality of driving units 40.

Specifically, the lamp device for a vehicle according to an implementation has an advantage of achieving two or more light distribution modes using the light-emitting unit 20, which is embodied as a P-OLED.

Described in more detail, the lamp device may be controlled such that some region of the light-emitting unit 20 emits light to carry out one light distribution mode (hereinafter, referred to as a "first mode") among the high beam radiation mode, the low beam radiation mode, the one lateral turning direction radiation mode, the opposite lateral turning direction radiation mode and the turn signal lamp radiation mode and a remaining region of the light-emitting unit 20 emits light to carry out another light distribution mode (hereinafter, referred to as a "second mode") among the above radiation modes except for the first mode. This is possible due to the characteristics of the P-OLED, which is capable of controlling the intensity of illumination and the color of the light emitted from the entire region or the partial region of the light-emitting surface.

Preferably, in some implementations the light emission controller may perform a control process such that the intensity of illumination of the light that is emitted from the light-emitting surface to carry out the first and second modes is higher than that of the light that is emitted from the entire region of the light-emitting surface to carry out only one light distribution mode among the high beam radiation mode, the low beam radiation mode, the one lateral turning direction radiation mode, the opposite lateral turning direction radiation mode and the turn signal lamp radiation mode.

For example, when one light-emitting unit 20 is operated to emit light for one light distribution mode, the light is emitted from the entire region of the light-emitting surface. If it is assumed that the amount of light that is emitted from the entire region of the light-emitting surface for one light distribution mode is "1" and that one light-emitting unit 20 is operated to emit light for two light distribution modes, each region of the light-emitting surface for the corresponding light distribution mode is half of the entire region of the light-emitting surface. Thus, the amount of light that is emitted from each region of the light-emitting surface is also reduced to "½". Therefore, in order to realize the same illumination effect as when one light-emitting unit 20 carries out one light distribution mode, there is a need to control the light-emitting unit 20 such that the intensity of illumination of the light that is emitted from the light-emitting surface to carry out two light distribution modes is higher than that of the light that is emitted from the entire region of the light-emitting surface to carry out one light distribution mode.

Referring to FIG. 4A, one light-emitting unit 20 may be controlled such that a region of the light-emitting surface emits light for the low beam radiation mode and the remaining region of the light-emitting surface emits light for the high beam radiation mode. At this time, the driving unit controller may control the operation of at least one of the one lateral driving unit 40a and the opposite lateral driving unit 40b such that the region of the light-emitting surface that emits light for the low beam radiation mode is bent forward and backward about the fixed middle portion of the light-emitting surface (indicated by ① in FIG. 4A), and may control the operation of at least one of the upper driving unit 40c and the lower driving unit 40d such that the region of the light-emitting surface that emits light for the low beam radiation mode is further slanted about the fixed middle portion of the light-emitting surface (indicated by ② in FIG. 4A). This control process of changing the shape of the light-emitting surface for the low beam radiation mode may be similarly applied to the change in shape of the light-emitting surface for the high beam radiation mode.

In some implementations, it is preferable for the light emission controller to perform a control process such that the intensity of illumination of the light emitted from the light-emitting surface to carry out the low beam radiation mode and the high beam radiation mode is two times as high as that of the light emitted from the entire region of the light-emitting surface to carry out one light distribution mode.

Similarly, referring to FIG. 4B, one light-emitting unit 20 may be controlled such that a region of the light-emitting surface emits light for the one lateral turning direction radiation mode or the opposite lateral turning direction radiation mode and the remaining region of the light-emitting surface emits light for the low beam radiation mode. The driving unit controller controls the driving unit 40 according to the same principle as in the case of FIG. 4A. Therefore, a duplicate explanation of the process of controlling the driving unit 40 will be omitted.

In some implementations, it is preferable for the light emission controller to perform a control process such that the intensity of illumination of the light emitted from the light-emitting surface to carry out the one lateral turning direction radiation mode or the opposite lateral turning direction radiation mode and the low beam radiation mode is two times as high as that of the light emitted from the entire region of the light-emitting surface to carry out one light distribution mode.

Referring to FIG. 4C, one light-emitting unit 20 is controlled in the same manner as the case in FIG. 4B, except that the region of the light-emitting surface that is used for the one lateral turning direction radiation mode or the opposite lateral turning direction radiation mode in the case in FIG. 4B emits light for the turn signal lamp radiation mode. Since the driving unit controller and the light emission controller perform a control process according to the same principle as in the case described above, a duplicate explanation thereof will be omitted.

The lamp device for a vehicle according to an implementation may further include a vehicle inclination detection unit for detecting a transverse inclination of the traveling vehicle, a longitudinal inclination of the traveling vehicle, and the state of the road ahead of the traveling vehicle.

Here, any means for detecting the environment surrounding the traveling vehicle, including the state of the road on which the vehicle is traveling, is included in the vehicle inclination detection unit of the present disclosure.

Further, the environment surrounding the traveling vehicle includes factors that have had an influence on the traveling vehicle (for example, the bumpiness of the road causing vibrations of the vehicle body, the inclination of the road causing inclination of the vehicle body, etc.), and the state of the road ahead of the vehicle, on which the vehicle is expected to travel based on the predicted traveling direction of the vehicle.

The vehicle inclination detection unit may be embodied as an inclination sensor or a gyro sensor, which is mechanically mounted to the vehicle body in order to detect transverse inclination and longitudinal inclination of the vehicle. Further, the vehicle inclination detection unit may be embodied as an image-obtaining unit for use in an advanced driver assistant system (ADAS), which obtains an image of the road ahead of the vehicle on which the vehicle is expected to travel, analyzes the obtained image, and predicts the state of the road.

The ADAS is a system assisting safe driving by obtaining an image of the environment surrounding the traveling vehicle, analyzing the obtained image, and immediately alerting the driver or performing an operation of coping with threats to safe driving on the basis of the analysis result.

The vehicle inclination detection unit may be embodied as a camera unit serving as an image-obtaining unit for obtaining an image to implement the ADAS. The camera unit may include a mono camera or two or more stereo cameras capable of capturing a stereoscopic image of the environment surrounding the vehicle, including the road.

The driving unit controller and the light emission controller may control the driving unit 40 and the light-emitting unit 20 on the basis of the information about the transverse inclination and the longitudinal inclination of the traveling vehicle, which is transferred from the vehicle inclination detection unit.

For example, referring to FIG. 5, in the case in which the vehicle sequentially travels on an uphill road, a downhill road and a flat road, the driving unit 40 and the light-emitting unit 20 are controlled three times in different manners.

First, when the traveling vehicle reaches the start point of the uphill road and starts to climb the uphill road, if the traveling direction radiation mode, among the variety of light distribution modes, is activated, the driver cannot secure vision of the distant front region on the uphill road.

Therefore, when it is determined that the state of the road ahead of the traveling vehicle, which is detected by the vehicle inclination detection unit, is the start point of the uphill road, the driving unit controller controls a plurality of driving units 40 such that the high beam radiation mode is temporarily activated until the vehicle has completely entered the uphill road. The process of controlling a plurality of driving units 40 using the driving unit controller in order to carry out the high beam radiation mode has already been described above in detail.

At this time, the light emission controller performs a control process such that the intensity of illumination of the light emitted from the upper light-emitting surface of the light-emitting unit 20 is temporarily higher than that of the light emitted from the lower light-emitting surface until the vehicle has completely entered the uphill road, thereby more securely achieving the high beam radiation mode.

Next, when the vehicle reaches the end point of the uphill road and starts to travel down the downhill road, if the traveling direction radiation mode, among the variety of light distribution modes, is activated, the driver cannot secure vision of the distant front region on the downhill road.

Therefore, when it is determined that the state of the road ahead of the traveling vehicle, which is detected by the vehicle inclination detection unit, is the end point of the uphill road or the start point of the downhill road, the driving unit controller controls a plurality of driving units 40 such that the low beam radiation mode is temporarily activated until the vehicle has completely entered the downhill road. The process of controlling a plurality of driving units 40 using the driving unit controller in order to carry out the low beam radiation mode has already been described above in detail.

At this time, the light emission controller performs a control process such that the intensity of illumination of the light emitted from the lower light-emitting surface of the light-emitting unit 20 is temporarily higher than that of the light emitted from the upper light-emitting surface until the vehicle has completely entered the downhill road, thereby more securely achieving the low beam radiation mode.

Finally, when the vehicle reaches the end point of the downhill road and starts to travel on the flat road, if the traveling direction radiation mode, among the variety of light distribution modes, is activated, the driver cannot secure vision of the distant front region on the flat road.

Therefore, when it is determined that the state of the road ahead of the traveling vehicle, which is detected by the vehicle inclination detection unit, is the end point of the downhill road, the driving unit controller controls a plurality of driving units 40 such that the high beam radiation mode is temporarily activated until the vehicle has completely entered the flat road.

At this time, the light emission controller performs the same control process as the above-described case of the high beam radiation mode.

In the case in which the vehicle travels on a bumpy unpaved road, the vehicle may rock severely from side to side and the headlamp device of the vehicle may also rock from side to side.

In the lamp device for a vehicle according to an implementation, when the vehicle inclination detection unit detects that the vehicle is tilted in one lateral direction or the opposite lateral direction, the driving unit controller may control a plurality of driving units 40 such that the light emitted from the light-emitting surface of the light-emitting unit 20 is projected to the same target area as when rackets 30 provided in the lamp hinclination of the traveling vehicle, which is detected by the vehicle inclination detection unit, is "0". Further, the light emission controller may control the intensity of illumination of the light-emitting unit 20 such that the brightest light is projected to the target area. As described above, even when the vehicle rocks from side to side, the driving unit controller and the light emission controller control a plurality of driving units 40 and the light-emitting unit 20 so as to consistently project the brightest light to the target area, thereby preventing the driver's vision from being obscured by the rocking of the vehicle and resultantly preventing an accident.

So far, the lamp device for a vehicle according to an implementation, which includes the light-emitting unit 20, which is configured to be capable of being changed in shape, and the bracket 30, which is configured to support the light-emitting unit 20 and to induce the change in shape of the light-emitting unit 20, has been described in detail. However, the present disclosure is not limited to the above-described implementation. Examples of another implementation is described with reference to FIGS. 6 to 9, below.

Figure 6:
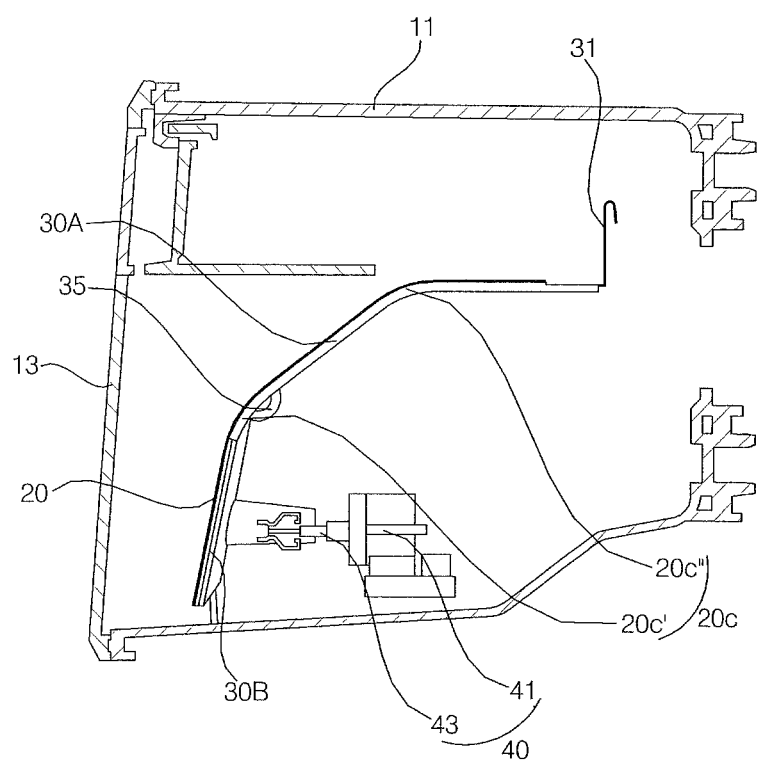
FIG. 6 is a diagram illustrating a partially cut perspective view showing an example of a lamp device for a vehicle according to another implementation.
Figure 7:
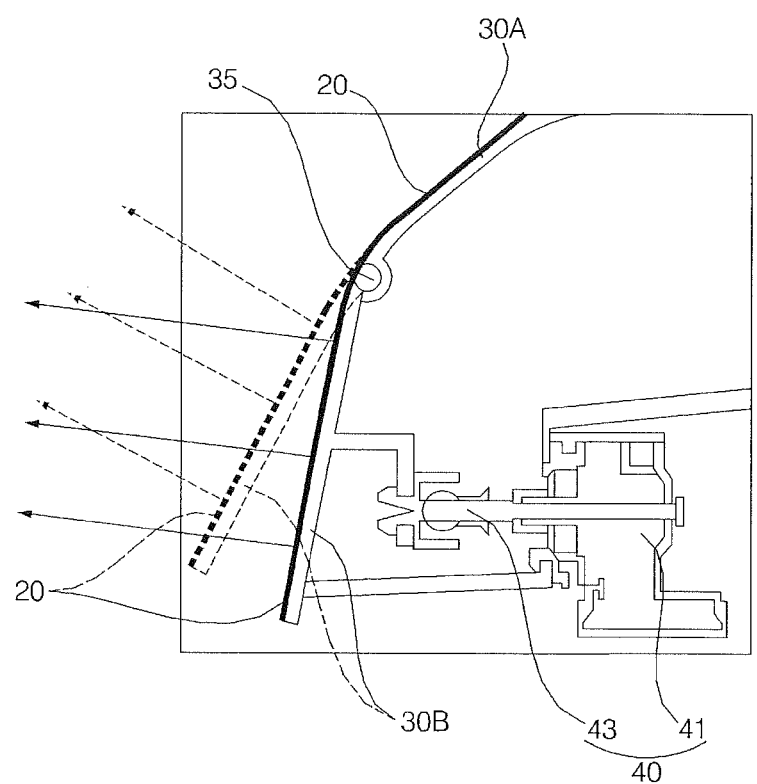
FIG. 7 is a diagram illustrating sectional views of examples of light distribution modes using the implementation shown in FIG. 6.
Figure 8:
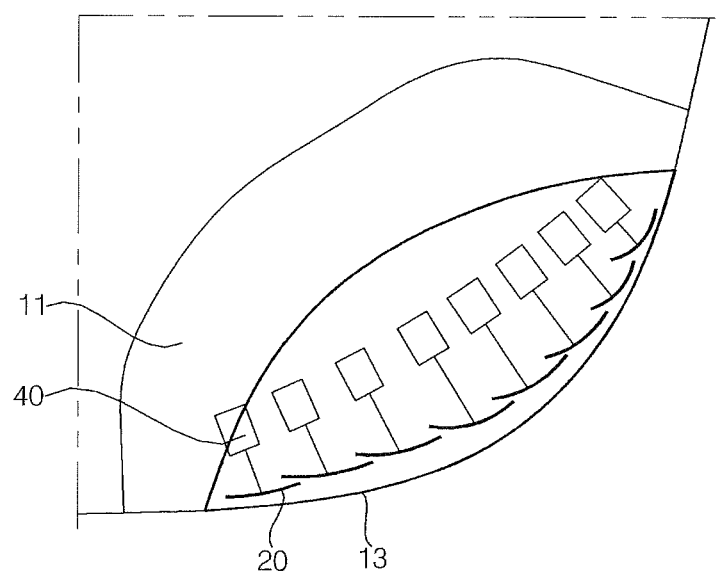
FIG. 8 is a diagram illustrating an example of a horizontal sectional view of FIG. 6.
Figure 9:
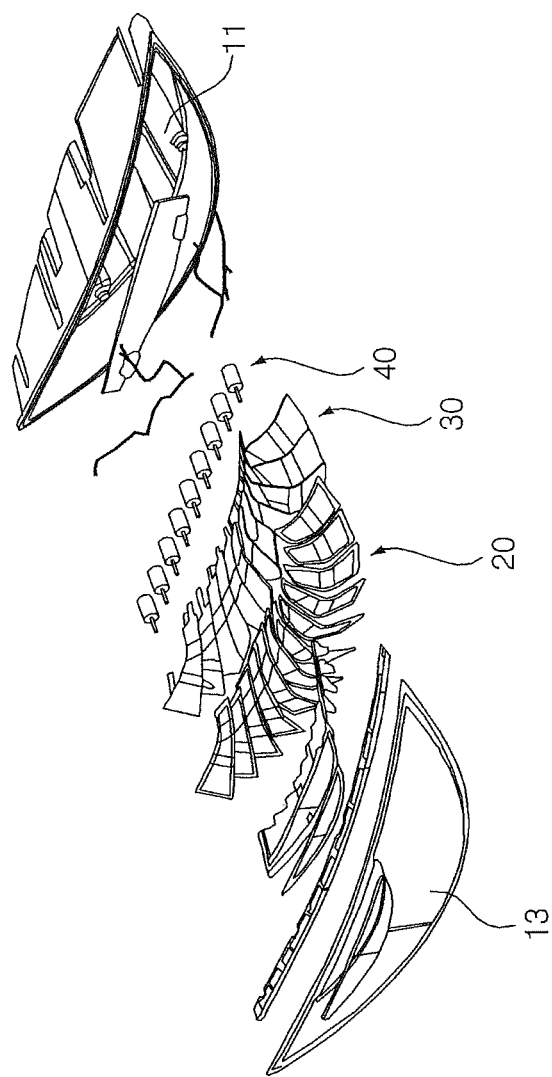
FIG. 9 is a diagram illustrating an example of an exploded perspective view of FIG. 6.

FIG. 6 is a partially cut perspective view showing a lamp device for a vehicle according to another implementation, FIG. 7 is a sectional view illustrating a variety of light distribution modes using the implementation shown in FIG. 6, FIG. 8 is a horizontal sectional view of FIG. 6, and FIG. 9 is an exploded perspective view of FIG. 6.

A lamp device for a vehicle according to another implementation, as shown in FIGS. 6 to 9, includes a lamp housing 11, a plurality of light-emitting units 20 provided in the lamp housing 11, and a plurality of brackets 30 provided in the lamp housing 11. The number of brackets 30 is the same as the number of light-emitting units 20.

The previous implementation of FIGS. 1 to 4C provided one bracket 30 made of a flexible material that was changed in shape by the driving unit 40. In the implementation of FIGS. 6 to 9, a plurality of brackets 30 are provided, each of which includes a fixed portion and a movable portion controlled to change the shape of a corresponding light-emitting unit 20.

In the example of FIGS. 6 to 9, a plurality of light-emitting units 20 is arranged in the horizontal direction in the lamp housing 11 and spaced a predetermined distance apart from each other. A plurality of brackets 30 is arranged in the horizontal direction in the lamp housing 11 spaced a predetermined distance apart from each other. There is further provided a plurality of driving units 40, the number of which may be the same as the number of light-emitting units 20 and the number of brackets 30.

Described in more detail, as shown in FIG. 6, each of the brackets 30 may include a fixed link plate 30A, which supports some region of a light-emitting surface formed on the light-emitting unit 20, and a movable link plate 30B, which is hinged to the fixed link plate 30A so as to be moved by the driving unit 40 and which supports the remaining region of the light-emitting surface of the light-emitting unit 20.

The fixed link plate 30A may be secured to a certain element in the lamp housing 11, and in some implementations preferably functions to support the upper light-emitting surface of the light-emitting unit 20.

The movable link plate 30B is coupled to an operating rod 43 of the driving unit 40. The lower end portion of the movable link plate 30B pivots forward and backward about the hinge-coupled portion with the fixed link plate 30A in response to the sliding motion of the operating rod 43, thereby moving the lower light-emitting surface of the light-emitting unit 20.

Hereinafter, for convenience of explanation, the light-emitting surface of the light-emitting unit 20 that is disposed at an upper portion and is supported by the fixed link plate 30A is referred to as a "fixed light-emitting surface" and the light-emitting surface of the light-emitting unit 20 that is disposed at a lower portion and is supported by the movable link plate 30B is referred to as a "movable light-emitting surface."

For example, the light-emitting surface of the light-emitting unit 20 may include the fixed light-emitting surface, which is disposed at an upper portion, and the movable light-emitting surface, which is disposed at a lower portion.

As shown in FIG. 6, the light-emitting surface may be divided into the upper fixed light-emitting surface and the lower movable light-emitting surface by at least one bending line 20c (20c' and 20c"), which is formed at the boundary between the fixed link plate 30A and the movable link plate 30B.

The fixed light-emitting surface may be slanted forward and downward or backward and downward at a first inclination angle with respect to the horizontal plane, and the movable light-emitting surface may be slanted forward and downward or backward and downward at a larger inclination angle than the first inclination angle with respect to the horizontal plane.

Therefore, the fixed light-emitting surface may be suitable for the high beam radiation mode, among the above-described variety of light distribution modes, and the movable light-emitting surface may be suitable for the low beam radiation mode. However, in some cases, the movable light-emitting surface may be changed in shape by the driving unit 40 in the high beam radiation mode, thereby more precisely achieving the high beam radiation mode together with the fixed light-emitting surface.

For example, in addition to the amount of light emitted from the fixed light-emitting surface, which may be predetermined to carry out the high beam radiation mode, the amount of light emitted from the movable light-emitting surface, which is changed in shape by the driving unit 40, is precisely adjusted, thereby satisfying the optimal amount of light in the high beam radiation mode, which varies depending on the variable environment surrounding the traveling vehicle.

The light distribution modes using the lamp device for a vehicle according to this implementation, constituted as described above, will now be described.

Referring to FIG. 7, in the high beam radiation mode, among the variety of light distribution modes, a plurality of brackets 30 and a plurality of light-emitting units 20 may be controlled such that the light-emitting surface is changed in shape so as to concentrate the projected light on the area in the upward direction from the road surface.

Described in more detail, as shown in FIG. 8, in the case in which the lamp device is disposed at the front left portion of the vehicle body, a plurality of light-emitting units 20 is arranged in the horizontal direction in the lamp housing 11 such that they are spaced a predetermined distance apart from each other, and the light-emitting units 20 located at the relatively leftward position are formed to be bent rearward, similar to the case in which one light-emitting unit, embodied as a P-OLED, is provided in the lamp housing.

Among a plurality of light-emitting units 20 arranged as above, the light-emitting units 20 that are located close to the middle portion of the vehicle body (e.g., the relatively rightward position) may be suitable for the high beam radiation mode when the vehicle travels straight, and the light-emitting units 20 that are located close to the side portion of the vehicle body (e.g., the relatively leftward position) may be suitable for the high beam radiation mode when the vehicle turns in the lateral direction.

Therefore, in the high beam radiation mode, a plurality of brackets 30 and a plurality of light-emitting units 20 may be controlled such that the movable link plate 30B moves forward with respect to the fixed link plate 30A in order to further concentrate the projected light on the rear in the upward direction from the road surface and such that the intensity of illumination of the light emitted from the light-emitting units 20 located at the relatively leftward position (e.g., the side portion of the vehicle body) is higher than that of the light emitted from the light-emitting units 20 located at the relatively rightward position (e.g., the middle portion of the vehicle body).

Referring to FIG. 7, in the low beam radiation mode, among the variety of light distribution modes, a plurality of brackets 30 and a plurality of light-emitting units 20 may be controlled such that the light-emitting surface is changed in shape so as to concentrate the projected light on the area in the downward direction toward the road surface.

Described in more detail, as shown in FIG. 8, a plurality of brackets 30 and a plurality of light-emitting units 20 may be controlled such that the movable link plate 30B moves backward with respect to the fixed link plate 30A in order to securely carry out the low beam radiation mode and such that the intensity of illumination of the light emitted from the light-emitting units 20 located at the relatively leftward position (e.g., the side portion of the vehicle body) is higher than that of the light emitted from the light-emitting units 20 located at the relatively rightward position (e.g., the middle portion of the vehicle body).

Further, according to the lamp device for a vehicle according to this implementation, in the one lateral turning direction radiation mode or the opposite lateral turning direction radiation mode, a plurality of brackets 30 and a plurality of light-emitting units 20 may be controlled such that the light-emitting surface is changed in shape so that the projected light is concentrated on the area in the direction in which the vehicle turns.

Described in more detail, as shown in FIG. 8, in the case in which the vehicle turns to the left, among a plurality of brackets 30 and a plurality of light-emitting units 20, the light-emitting units 20 that are disposed at the relatively leftward position (e.g., the side portion of the vehicle body) and have a curved shape are actually needed to carry out the left turning direction radiation mode. Therefore, it is preferable in some implementations for the intensity of illumination of the light emitted from the light-emitting units 20 disposed at the relatively leftward position to be higher than that of the light emitted from the light-emitting units 20 disposed at other positions.

In the case in which the vehicle turns to the right, a plurality of brackets 30 and a plurality of light-emitting units 20 may also be controlled in a manner similar to the case in which the vehicle turns to the left.

Further, according to the lamp device for a vehicle according to this implementation, in the case in which the turn signal lamp radiation mode is activated simultaneously with the one lateral turning direction radiation mode or the opposite lateral turning direction radiation mode, a plurality of light-emitting units 20 may be controlled such that they are turned off or on sequentially from the light-emitting unit 20 farthest from the direction in which the vehicle turns to the light-emitting unit 20 closest to the direction in which the vehicle turns.

The lamp device for a vehicle according to this implementation, as shown in FIG. 9, includes a lamp housing 11 having a predetermined mounting space formed therein, a plurality of driving units 40 arranged so as to be aligned with each other in the horizontal direction in the lamp housing 11, a plurality of brackets 30, each including a movable link plate 30B secured to the corresponding driving unit 40 and a fixed link plate 30A secured to the interior of the lamp housing 11, a plurality of light-emitting units 20 disposed to be in surface contact with the front surface of the corresponding brackets 30, and a transparent outer lens 13 configured to cover an opening of the lamp housing 11 and to protect the light-emitting units 20 and the brackets 30 mounted in the lamp housing 11.

A lamp housing 11, which constitutes the headlamp device for a vehicle, is disposed at each of the front left corner and the front right corner of the vehicle body. The lamp housing 11 includes left and right ends, which have a pointed shape that matches the line determined by the design of the vehicle, a curved upper side formed between the left and right ends, and a curved lower side formed between the left and right ends.

A plurality of light-emitting units 20, which project light in the forward traveling direction or the lateral turning direction of the vehicle, are arranged in the horizontal direction in the mounting space formed in the lamp housing 11. Further, the plurality of light-emitting units 20 may be spaced a predetermined distance apart from each other in the longitudinal direction of the vehicle such that the light-emitting unit 20 that is closest to the middle portion of the vehicle body is located at the foremost position and the light-emitting unit 20 that is closest to the side portion of the vehicle body is located at the rearmost position.

The lamp device for a vehicle according to this implementation constructed as above has an advantage in that a plurality of light-emitting units 20 can be controlled simultaneously or individually, thereby achieving a greater variety of light distribution modes.

As is apparent from the above description, according to a lamp device for a vehicle of the present disclosure, since a variety of light distribution patterns can be achieved using a bendable P-OLED, it is possible to simplify the constitution of the lamp device, to provide a driver with convenience in driving, and to manufacture a high-quality vehicle. Further, safe driving can be ensured by providing a driver with clear vision in a manner that is responsive to the environment surrounding the vehicle.

Although examples of implementations have been disclosed for illustrative purposes, those skilled in the art will appreciate that various modifications, additions and substitutions are possible, without departing from the scope and spirit of the invention as disclosed in the accompanying claims.

What is claimed is:

1. A lamp device for a vehicle, the lamp device comprising:
    a lamp housing;
    a light-emitting unit disposed in the lamp housing and comprising a light-emitting surface formed thereon that is configured to generate and emit light which is adjustable in an intensity of illumination or a color of illumination;
    a bracket that is configured to support the light-emitting unit to be mounted in the lamp housing, and that comprises a first surface configured to contact the light-emitting unit; and
    a plurality of driving units configured to be coupled to the bracket, and configured to apply a driving force to the bracket that changes a shape of the light-emitting surface of the light-emitting unit, the plurality of driving units comprising an operating rod connected to a rear surface of the bracket, and a driving motor configured in drive the operating rod,
    wherein the shape of the light-emitting surface is configured to be adjustable in conjunction with a change in a shape of the bracket,
    the lamp device configured to at least partially change, based on a plurality of lighting modes, at least one of the shape of the light-emitting surface, the intensity of illumination emitted from the light-emitting surface, or the color of illumination emitted from the light-emitting surface,
    wherein the plurality of lighting modes comprises:
        a traveling direction radiation mode in which light is emitted from the light-emitting surface of the light-emitting unit in a forward traveling direction of the vehicle;
        a first lateral turning direction radiation mode in which light is emitted from the light-emitting surface of the light-emitting unit in a first lateral direction of the vehicle;
        a second lateral turning direction radiation mode in which light is emitted from the light-emitting surface of the light-emitting unit in a second lateral direction of the vehicle that is opposite the first lateral direction;
        a high beam radiation mode in which light is emitted from the light-emitting surface of the light-emitting unit in an upward direction; and
        a low beam radiation mode in which light is emitted from the light-emitting surface of the light-emitting unit in a downward direction,
    wherein the plurality of driving units comprises:
        a first lateral driving unit configured to, based on the lamp device being in the traveling direction radiation mode, move the bracket so that light is emitted in the first lateral direction for the first lateral turning direction radiation mode;
        a second lateral driving unit configured to, based on the lamp device being in the traveling direction radiation mode, move the bracket so that light is emitted in the second lateral direction for the second lateral turning direction radiation mode;
        an upper driving unit configured to, based on the lamp device being in the traveling direction radiation mode, move the bracket so that light is emitted in an upward direction for the high beam radiation mode; and
        a lower driving unit configured to, based on the lamp device being in the traveling direction radiation mode, move the bracket so that light is emitted in a downward direction for the low beam radiation mode,
    wherein the upper driving unit, the lower driving unit, the first lateral driving unit, and the second lateral driving unit are respectively coupled to an upper end portion of the bracket, a lower end portion of the bracket, a first lateral portion of the bracket, and a second lateral portion of the bracket that is opposite the first lateral end portion, and configured to respectively change the shape of the upper end portion of the bracket, the lower end portion of the bracket, the first lateral end portion of the bracket, and the second lateral end portion of the bracket.

2. The lamp device according to claim 1, wherein the bracket comprises:
    a fixed portion corresponding to the light-emitting surface of the light-emitting unit that is configured to emit light for the traveling direction radiation mode; and
    movable portions configured to be moved by the first lateral driving unit, the second lateral driving unit, the upper driving unit, and the lower driving unit to change the shape of the light-emitting surface of the light-emitting unit.

3. The lamp device according to claim 2, further comprising:
    a driving unit controller configured to control the plurality of driving units; and
    a light emission controller configured to control the intensity of illumination and the color of illumination emitted from an entire region or a partial region of the light-emitting surface of the light-emitting unit,
    wherein the driving unit controller is configured to, in the first lateral turning direction radiation mode or the second lateral turning direction radiation mode, control the first lateral driving unit and the second lateral driving unit such that the first lateral end portion and the second lateral end portion of the bracket are bent forward or backward about the fixed portion of the bracket.

4. The lamp device according to claim 3, further comprising:
    a vehicle inclination detection unit configured to detect a transverse inclination of the vehicle, a longitudinal inclination of the vehicle, and a state of a road ahead of the vehicle,
    wherein the driving unit controller is further configured to control the driving unit and the light emission controller control is configured to control the light-emitting unit each based on information about the transverse inclination and the longitudinal inclination of the vehicle that is transferred from the vehicle inclination detection unit.

5. The lamp device according to claim 4, wherein:
the driving unit controller is further configured to, based on the vehicle inclination detection unit detecting that the vehicle is tilted in a first lateral direction or in a second lateral direction that is opposite the first lateral direction:
control the driving unit such that light emitted from the light-emitting surface of the light-emitting unit is projected to a target area on which light is projected while the inclination of the vehicle detected by the vehicle inclination detection unit has a value of "0", and
the light emission controller is further configured to, based on the vehicle inclination detection unit detecting that the vehicle is tilted in the first lateral direction or in the second lateral direction that is opposite the first lateral direction:
control the intensity of the illumination emitted from the light-emitting unit such that a brightest part of the illumination is projected to the target area.

6. The lamp device according to claim 4, wherein:
the driving unit controller is further configured to, based on the light-emitting unit being disposed at a front portion of the vehicle, and based on a determination that a state of a road ahead of the vehicle detected by the vehicle inclination detection unit is a start point of an uphill road:
control the upper driving unit and the lower driving unit to bend the upper end portion and the lower end portion of the bracket in a same direction about the fixed portion of the bracket, and
the light emission controller is further configured to, based on the light-emitting unit being disposed at the front portion of the vehicle, and based on a determination that the state of the road ahead of the vehicle detected by the vehicle inclination detection unit is the start point of the uphill road:
control the light-emitting unit such that an intensity of illumination of light emitted from an upper portion of the light-emitting surface is temporarily higher, until the vehicle has completely entered the uphill road, than an intensity of illumination of light emitted from a portion of the light-emitting surface other than the upper portion of the light-emitting surface.

7. The lamp device according to claim 4, wherein:
the driving unit controller is further configured to, based on the light-emitting unit being disposed at a front portion of the vehicle, and based on a determination that a state of a road ahead of the vehicle detected by the vehicle inclination detection unit is an end point of an uphill road or a start point of a downhill road:
control the upper driving unit and the lower driving unit to bend the upper end portion and the lower end portion of the bracket in a same direction about the fixed portion of the bracket, and
the light emission controller is further configured to, based on the light-emitting unit being disposed at the front portion of the vehicle, and based on a determination that the state of the road ahead of the vehicle detected by the vehicle inclination detection unit is the end point of the uphill road or the start point of the downhill road:
control the light-emitting unit such that an intensity of illumination of light emitted from a lower portion of the light-emitting surface is higher than an intensity of illumination of light emitted from a portion of the light-emitting surface other than the lower portion of the light-emitting surface.

8. The lamp device according to claim 4, wherein;
the driving unit controller is further configured to, based on the light-emitting unit being disposed at a front portion of the vehicle, and based on a determination that a state of a road ahead of the vehicle detected by the vehicle inclination detection unit is an end point of a downhill road:
control the upper driving unit and the lower driving unit to bend the upper end portion and the lower end portion of the bracket in a same direction about the fixed portion of the bracket, and
the light emission controller is further configured to, based on the light-emitting unit being disposed at the front portion of the vehicle, and based on a determination that the state of the road ahead of the vehicle detected by the vehicle inclination detection unit is the start point of the uphill road:
control the light-emitting unit such that an intensity of illumination of light emitted from an upper portion of the light-emitting surface is higher than an intensity of illumination of light emitted from a portion of the light-emitting surface other than the lower portion of the light-emitting surface.

9. The lamp device according to claim 3, wherein the light emission controller is configured to, in the first lateral turning direction radiation mode or the second lateral turning direction radiation mode, control the light-emitting unit such that light emitted from a first lateral portion of the light-emitting surface corresponding to a direction in which the vehicle turns is different from light emitted from a second lateral portion of the light-emitting surface that is opposite the first lateral portion of the light-emitting surface.

10. The lamp device according to claim 9, wherein the plurality of lighting nodes further comprises a turn signal mode in which light is emitted from the light-emitting surface of the light-emitting unit in a turning direction of the vehicle,
the light-emitting unit further comprises a plurality of matrix light-emitting cells provided on the light-emitting surface in a form of a band shape extending in a vertical direction and spaced apart from each other in a horizontal direction, and
the light emission controller is further configured to, in the first lateral turning direction radiation mode or the second lateral turning direction radiation mode, control the light-emitting unit such that the plurality of matrix light-emitting cells flash or turn on to indicate the turning direction of the vehicle in the turn signal mode.

11. The lamp device according to claim 3, wherein the driving unit controller is further configured to:
control, in the high beam radiation mode or the low beam radiation mode, the upper driving unit and the lower driving unit such that the upper end portion and the lower end portion of the bracket are bent in a same direction about the fixed portion of the bracket.

12. The lamp device according to claim 11, wherein the light emission controller is further configured to:
control, in the high beam radiation mode or the low beam radiation mode, the light-emitting unit such that light emitted from an upper portion of the light-emitting surface is different than light emitted from a lower portion of the light-emitting surface.

13. The lamp device according to claim 1, wherein the bracket comprises:
- a fixed link plate configured to support a first region of a light-emitting surface formed on the light-emitting unit; and
- a movable link plate that is linked to the fixed link plate so as to be moved by the driving unit and configured to support a second region of the light-emitting surface other than the first region,
- the light-emitting unit is one of a plurality of light-emitting units that are arranged in a horizontal direction in the lamp housing while being spaced a predetermined distance apart from each other,
- the bracket is one of a plurality of brackets that are arranged in a horizontal direction in the lamp housing while being spaced a predetermined distance apart from each other, and
- the driving unit is one of a plurality of driving units, a number of the plurality of driving units being equal to a number of the plurality of light-emitting units and a number of the plurality of brackets.

14. The lamp device according to claim 13, wherein the light-emitting surface of the light-emitting unit comprises:
- a fixed light-emitting surface disposed at an upper portion of the light-emitting surface and supported by the fixed link plate; and
- a movable light-emitting surface disposed at a lower portion of the light-emitting surface and supported by the movable link plate,
- the fixed light-emitting surface being slanted forward and downward or backward and downward at a first inclination angle with respect to a horizontal plane, and
- the movable light-emitting surface being slanted forward and downward or backward and downward at a second inclination angle that is larger than the first inclination angle with respect to the horizontal plane.

15. The lamp device according to claim 14, wherein the lamp device is further configured to, in the first lateral turning direction radiation mode or in the second lateral turning direction radiation mode, control the plurality of brackets and the plurality of light-emitting units such that:
- the light-emitting surface of each light-emitting unit is changed in shape and projects light to be concentrated on an area in a turning direction of the vehicle; and
- an intensity of illumination of light emitted from a first group of light-emitting units among the plurality of light-emitting units disposed at a position corresponding to a turning direction of the vehicle is higher than an intensity of illumination of light emitted from light-emitting units among the plurality of light-emitting units other than the first group of light-emitting units.

16. The lamp device according to claim 14, wherein the lamp device is further configured to:
- in the high beam radiation mode, control the plurality of brackets and the plurality of light-emitting units such that the light-emitting surface of each light-emitting unit is changed in shape so that projected light is concentrated on an area in an upward direction from a road surface, and
- in the low beam radiation mode, control the plurality of brackets and the plurality of light-emitting units such that the light-emitting surface of each light-emitting unit is changed in shape so that projected light is concentrated on an area in a downward direction toward a road surface.

17. The lamp device according to claim 14, wherein the plurality of lighting modes further comprises a turn signal lamp radiation mode in which a light-emitting unit disposed at a position corresponding to a turning direction of the vehicle is repeatedly turned on and off, and
the lamp device is further configured to:
- based on the vehicle turning in a lateral direction, control the light-emitting unit disposed at a position corresponding to a turning direction of the vehicle to repeatedly turn on and off in the turn signal lamp radiation mode, and
- in the turn signal lamp radiation mode, control the plurality of light-emitting units to turn off or turn on sequentially from the light-emitting unit farthest from the turning direction of the vehicle to the light-emitting unit closest to the turning direction of the vehicle.

* * * * *